United States Patent [19]

Tanaka et al.

[11] Patent Number: 5,415,901
[45] Date of Patent: May 16, 1995

[54] LASER ABLATION DEVICE AND THIN FILM FORMING METHOD

[75] Inventors: Kunio Tanaka, Osaka; Youichi Ohnishi, Higashiosaka; Yoshikazu Yoshida, Izumi; Yukio Nishikawa, Ikeda, all of Japan

[73] Assignee: Matsushita Electric Industrial Co., Ltd., Osaka, Japan

[21] Appl. No.: 69,520

[22] Filed: Jun. 1, 1993

[30] Foreign Application Priority Data

Jun. 1, 1992 [JP] Japan .................. 4-140656

[51] Int. Cl.⁶ .................................. H01F 10/02
[52] U.S. Cl. ........................ 427/596; 118/50; 118/715; 427/128; 427/294; 427/561; 427/586; 427/597; 427/599
[58] Field of Search ............... 427/128–132, 427/561, 586, 599, 596, 597, 294; 118/715, 50

[56] References Cited

U.S. PATENT DOCUMENTS

| | | | |
|---|---|---|---|
| 5,017,277 | 5/1991 | Yoshida et al. | 204/298.02 |
| 5,065,697 | 11/1991 | Yoshida et al. | 118/719 |
| 5,082,545 | 1/1992 | Tanaka et al. | 204/298.03 |
| 5,159,169 | 10/1992 | Nishikawa et al. | 219/121.6 |

OTHER PUBLICATIONS

Komuro et al., "Preparation of High-$T_c$ Superconducting Films by Q-Switched YAG Laser Sputtering", *Japanese Journal of Applied Physics*, vol. 27, No. 1, Jan. 1988, pp. L34–L36.

*Primary Examiner*—Bernard Pianalto
*Attorney, Agent, or Firm*—Wenderoth, Lind & Ponack

[57] ABSTRACT

A laser ablation device for forming a thin film includes a vacuum chamber having a gas introduction port through which an oxidating gas is introduced into the chamber, and a light-transmittable section, a target holder disposed in the vacuum chamber for holding a target made of a film forming material of an oxide, an object holder confronting the target holder for holding an object on which the thin film is to be formed, a short wavelength laser which emits a first short wavelength laser light passing to the target in the vacuum chamber through the light-transmittable section from outside of the vacuum chamber, and a short wavelength laser light irradiating device for irradiating the object with a second short wavelength laser light passing into the vacuum chamber through the light-transmittable section from outside of the vacuum chamber. The second short wavelength laser light has an intensity lower than that of the first short wavelength laser light irradiating the target. Alternatively, a short wavelength laser light passing device causes the second short wavelength laser light to pass through the light-transmittable section from outside of the vacuum chamber and then to pass in the vicinity of a surface of the object in the vacuum chamber as approximately parallel to the surface of the object.

18 Claims, 6 Drawing Sheets

LASER ABLATION DEVICE AND THIN FILM FORMING METHOD

BACKGROUND OF THE INVENTION

The present invention relates to a laser ablation device for forming a thin film by means of a short wavelength laser light, and more particularly, to a laser ablation device for forming a soft magnetic thin film of an oxide.

A conventional example of a laser ablation device for forming an oxide thin film using a short wavelength laser light is described in Japanese Journal of Applied Physics, vol. 27 (1988) by S. Komuro et al. The constitution of the prior art will be described with reference to FIG. 6.

The conventional laser ablation device for forming a thin film includes a target holder 41' for holding a target 41 of the sintered body of Ni-Zn-ferrite as an oxide film forming material, and a substrate holder 42 (holder for an object on which a film is to be formed) confronting the target holder 41' to hold a substrate 43 (the object on which a film is to be formed) in a vacuum chamber 40. The vacuum chamber 40 has a discharging device 49, a gas introduction port 48, and a light-transmittable window 47. A short wavelength laser light 45 having a wavelength of 532 nm, which is the second higher harmonic laser light of a YAG laser 44 performing Q switching of a visible light and placed outside the vacuum chamber 40, is condensed by an optical system 46 and irradiates the target 41 through the light-transmittable window 47. A heater 42' is built into the substrate holder 42 to heat the substrate 43 to a predetermined temperature.

The operation of the above-described laser ablation device will be discussed with reference to FIG. 6.

In FIG. 6, after the vacuum chamber 40 is evacuated by the discharging device 49, $O_2$ gas or $N_2O$ gas is introduced into the chamber 40 from the gas introduction port 48. The short wavelength laser light 45 irradiates the target 41. As a result, ablated particles are projected from the sintered body of Ni-Zn-ferrite constituting the target 41 owing to the energy of the short wavelength laser light, and a thin film of Ni-Zn-ferrite is formed on the substrate 43 held by the substrate holder 42 opposed to the target 41.

At the time the thin film is formed, since the substrate 43 is heated to a predetermined temperature by the built-in heater 42' of the substrate holder 42, and an oxidating gas such as $O_2$ gas or $N_2O$ gas is introduced in the chamber 40 from the gas introduction port 48, the Ni-Zn-ferrite thin film formed on the substrate 43 reacts with the oxygen, whereby the oxygen deficiency of the Ni-Zn-ferrite thin film is reduced.

However, for an oxide of many components such as those represented by Ni-Zn-ferrite, the oxygen reacts only to a little extent and the oxygen deficiency of the thin film cannot be sufficiently reduced. Therefore, the prior art is capable of forming a thin film of high coercive force only.

In the event that the thin film of Ni-Zn-ferrite or the like formed by the conventional laser ablation device is to be employed as a soft magnetic film of low coercive force, it becomes necessary to impart characteristics to the film by which the film will exhibit lower coercive force. More specifically, the oxidation state of the thin film (valence, etc.) must be precisely adjusted to thereby sufficiently reduce the oxygen deficiency. For this purpose, the substrate 43 with the thin film has been conventionally heated under an oxidation atmosphere at high temperatures (for example, 800° C. or higher) and annealed for several hours. Therefore, a large number of processing steps are needed accompanied by the cost associated therewith.

Moreover, the above-mentioned annealing at high temperatures cannot be applied to a thin film head because the material of the head cannot withstand temperatures higher than 350° C. In other words, the conventional laser ablation device is useless when a thin film head is to be manufactured.

SUMMARY OF THE INVENTION

The object of the present invention is, therefore, to provide a laser ablation device which can control the crystalline state (including the oxidation state or the like) of a formed film at relatively low temperatures, while sufficiently reducing the oxygen deficiency of the film without requiring high-temperature annealing to improve the oxidation state, thereby eliminating the above-described drawbacks of the prior art.

In accomplishing these and other objects, according to a first aspect of the present invention, there is provided a laser ablation device for forming a thin film and which comprises: a vacuum chamber connected to a discharging device for creating a vacuum in the chamber and having a gas introduction port through which an oxidating gas is introduced into the chamber, and a light-transmittable section; a target holder disposed in the vacuum chamber for holding a target made of a film forming material of an oxide; an object holder confronting the target holder for holding an object; a short wavelength laser which emits a first short wavelength laser light passing from outside of the vacuum chamber to the target in the vacuum chamber through the light-transmittable section; and a short wavelength laser light irradiating device for irradiating the object held by the object holder in the vacuum chamber with a second short wavelength laser light passing through the light-transmittable section from outside of the vacuum chamber, the second short wavelength laser light having an intensity lower than that of the first short wavelength laser light irradiating the target.

According to the first aspect of the present invention, when the first short wavelength laser light irradiates the target inside the vacuum chamber into which the oxidating gas has been introduced, ablated particles of the film forming material constituting the target are projected from the target and migrate over the object held by the object holder, thereby forming a thin film. During this time, a second short wavelength laser light of an intensity lower than that of the first short wavelength laser light irradiating the target is directed onto the object via the light-transmittable section. Therefore, the migrating ablated particles are excited to readily react with the oxidating gas in the vicinity of the object, thus accelerating the oxygen reaction and the oxidation of the film. The oxygen deficiency of the formed film is hence reduced and the crystallizability of the film is improved.

According to a second aspect of the present invention, there is provided a laser ablation device for forming a thin film and which comprises: a vacuum chamber connected to a discharging device for creating a vacuum in the chamber and having a gas introduction port through which an oxidating gas is introduced into the chamber, and a light-transmittable section; a target holder disposed in the vacuum chamber for holding a target made of a film forming material of an oxide; an object holder confronting the target holder for holding an object; a short wavelength laser which emits a first short wavelength laser light passing from outside of the vacuum chamber to the target in the vacuum chamber through the light-transmittable section; and a short wavelength laser light passing device for causing a second short wavelength laser light to pass through the light-transmittable section from outside of the vacuum chamber and to pass in the vicinity of a surface of the object held by the object holder in the vacuum chamber as approximately parallel to the surface of the object, the second short wavelength laser light having an intensity lower than that of the first short wavelength laser light irradiating the target.

When the first short wavelength laser light irradiates the target in the vacuum chamber into which the oxidating gas has been introduced, ablated particles of the film forming material constituting the target project from the target and migrate over the object held by the object holder thereby forming a thin film. At this time, since the second short wavelength laser light is guided approximately parallel to the surface of the object in the vicinity of the surface of the object, the second short wavelength laser light irradiates the ablated particles before the particles reach the object, and accordingly, the ablated particles are excited to readily react with the oxidating gas in the vicinity of the object. Therefore, the oxidation is accelerated and the oxygen deficiency of the formed film is reduced, and moreover, the oxidating gas in the vicinity of the object is irradiated by the second short wavelength laser light to be dissociated to produce O radicals. The oxidation with the ablated particles is enhanced, and the oxidation of the formed film is accelerated, the oxygen deficiency of the formed film is reduced and the crystallizability is improved.

According to a further aspect of the present invention, the short wavelength laser light irradiating device may be an optical system which splits a short wavelength laser light of the short wavelength laser. Accordingly, only a single short wavelength laser is necessary.

According to a further aspect of the method of the present invention, the thin film may be formed on an object by using an oxide soft magnetic material as the target. Therefore, it is possible to form a thin film of excellent crystallizability with less oxygen deficiency, thereby achieving a soft magnetic thin film of low coercive force.

BRIEF DESCRIPTION OF THE DRAWINGS

These and other objects and features of the present invention will become clear from the following description of preferred embodiments thereof made with reference to the accompanying drawings, in which.

DETAILED DESCRIPTION OF THE PREFERRED EMBODIMENTS

Figure 1:
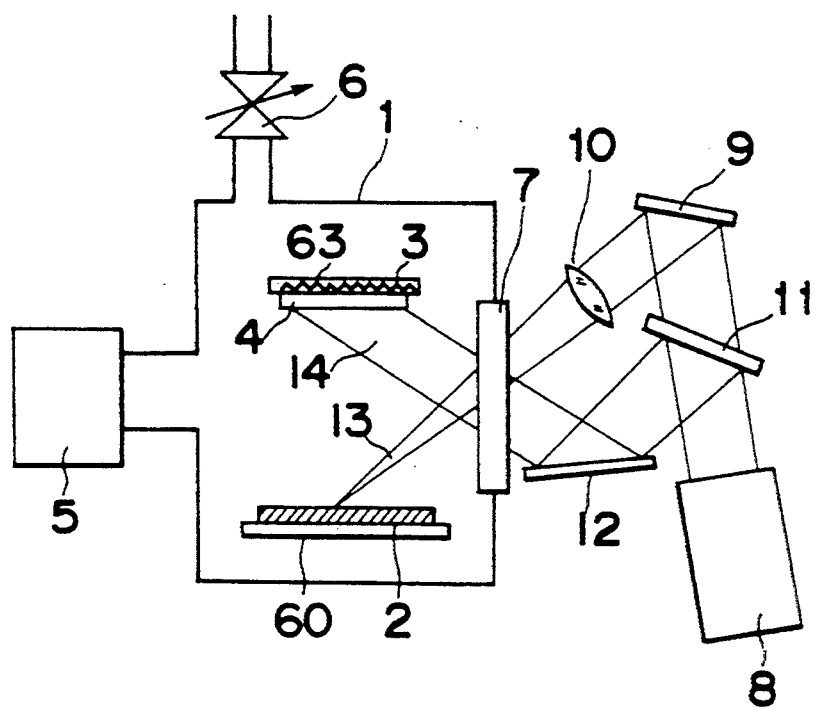
FIG. 1 is a schematic diagram of a first embodiment of a laser ablation device according to the present invention.

Before the description of the present invention proceeds, it is to be noted that like parts are designated by like reference numerals throughout the accompanying drawings.

The first embodiments of a laser ablation device and a method for forming a thin film on an object using an oxide soft magnetic material as a target, will be described with reference to FIG. 1.

In FIG. 1, the preferred embodiment of the laser ablation device includes an optical system, a vacuum chamber 1, an air discharging device 5 for evacuating the chamber 1, a gas introduction port 6 for introducing an oxidating gas ($O_2$, $N_2O$ or the like), a light-transmittable window 7 through which a laser light from an excimer laser passes and which is made of synthetic crystal, for example, a target holder 60 arranged in the vacuum chamber 1 for holding a target 2 made of a sintered body of Ni-Zn-ferrite which is an oxide film forming material (in some cases, the target holder may be omitted), a substrate holder 3 confronting the target holder 60 for holding a substrate 4 as an object on which a thin film is to be formed, and a short wavelength laser 8 for irradiating the target 2 in the vacuum chamber 1 with laser light of a short wavelength, the laser light passing through the light-transmittable window 7 from outside the vacuum chamber 1. The optical system includes a half mirror 11, mirrors 9 and 12, and a lens 10. Some of the short wavelength laser light from the short wavelength laser 8 passes through the half mirror 11, is reflected by the mirror 9, is condensed by the lens 10, and irradiates the target 2 as a short wavelength laser light 13 having a very small diameter directed through the light-transmittable window 7. The remaining part of the laser light from the short wavelength laser 8 is reflected by the half mirror 11 and the mirror 12 and irradiates the substrate 4 as a short wavelength laser light 14 having a certain large diameter. As an example, the short wavelength laser 8 comprises a KrF excimer laser emitting laser light having a wavelength of 248 mm. Alternatively, an ArF excimer laser or an XeCl excimer laser may be used as the short wavelength laser 8. A heater 63 is incorporated inside the substrate holder 3 to heat the substrate 4 thereon to a predetermined temperature. The position at which the short wavelength laser light 13 condensed by the lens 10 is incident on the target 2 can be changed by a mechanism provided for moving the short wavelength laser light 13 or the target 2.

Now, the operation of the laser ablation device will be described with reference to FIGS. 1 and 2.

Figure 2:
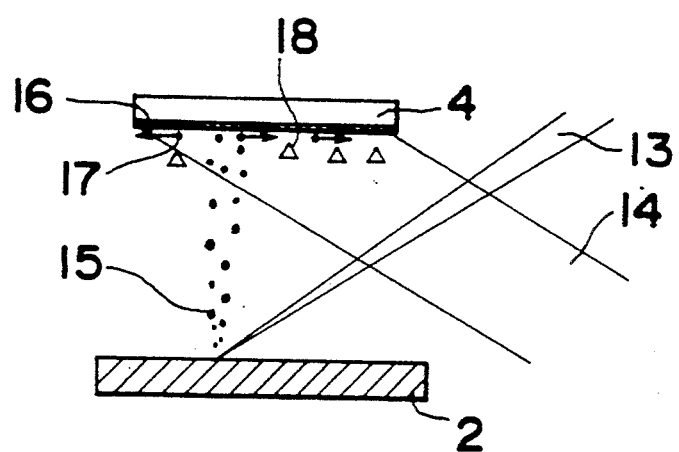
FIG. 2 shows the operation of the device of FIG. 1.

In FIGS. 1 and 2, the target 2 made of a sintered body (although not restricted to a sintered body) of Ni-Zn-ferrite as a film forming material is held by the target holder 60. The substrate 4 is supported by the substrate holder 3. After the vacuum chamber 1 is evacuated by the discharging device 5 to a predetermined degree of vacuum, an oxidative gas such as $O_2$ gas or $N_2O$ gas is supplied through the gas introduction port 6 to maintain the vacuum chamber 1 at a predetermined degree of vacuum. In this state, when the short wavelength laser light is emitted from the short wavelength laser 8, art of the laser light passes through the half mirror 11 and is reflected by the mirror 9, condensed by the lens 10, and irradiates the target 2 as the short wavelength laser light 13 directed through the light-transmittable window 7. The remaining part of the laser light is reflected by the half mirror 11 and the mirror 12 and irradiates the substrate 4 as a short wavelength laser light 14. As a result, ablated particles 15 of the sintered body of Ni-Zn-ferrite constituting the target 2 are projected from the target 2. These particles migrate over or move about the substrate 4 held by the substrate holder 3 and form a thin film 16. When the thin film 16 is being formed, the migrating ablated particles 17 are excited by the short wavelength laser light 14 irradiating the substrate 4. Therefore, the ablated particles 17 easily react with $O_2$ molecules 18 of the oxidating gas, etc. in the vicinity of the substrate 4.

Accordingly, the oxygen deficiency in the formed thin film is reduced. Since the migrating ablated particles 17 are excited during deposition, the crystallizability of the formed thin film 16 is improved. Although the substrate 4 is heated to about 300° C. by the built-in heater 63, it is possible to obtain a film of Ni-Zn-ferrite of a spinel single structure-crystal.

Since the short wavelength laser light 14 irradiates the substrate 4 simultaneously with the ablation, the coercive force of the Ni-Zn-ferrite film is improved from 100 Oe (oersted), in the case without the short wavelength laser light, to 20 Oe or lower.

In the instant embodiment, since the short wavelength laser light 14 irradiating the substrate 4 is not condensed by any lens, the intensity of the laser light 14 is approximately 1/10–1/100 of that of the short wavelength laser light 13 condensed by the lens 10. Therefore, there is no ablation at the substrate 4. However, if the intensity of the short wavelength laser light 14 is too strong, that is, the intensity of the laser light 14 is more than 1/10 of that of the short wavelength laser light 13, Zn or the like is ablated again from the film 16, whereby the magnetic properties of the film 16 are eventually deteriorated. If the intensity of the short wavelength laser light 14 is too weak, that is, the intensity of the laser light 14 is less than 1/100 of that of the short wavelength laser light 13, the above-desired effects cannot be obtained.

Figure 3:
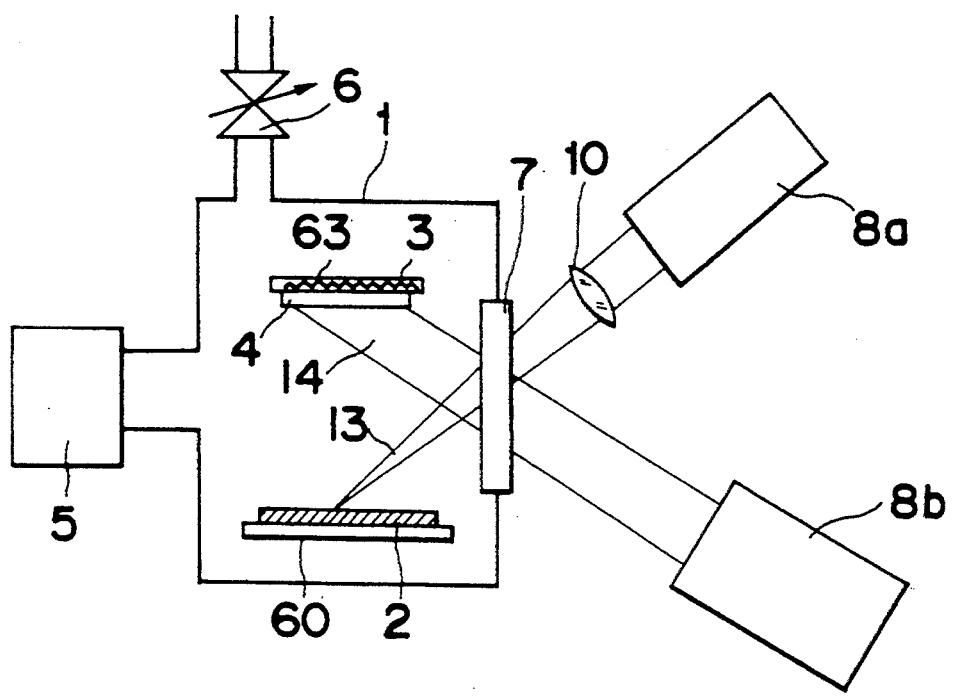
FIG. 3 is a schematic diagram of a modified form of the first embodiment of the laser ablation device.

Although the short wavelength laser light 14 is separated from the short wavelength laser light 13 by using the half mirror 11, it is possible to use a separate short wavelength laser 8b of 0.05J/cm² for irradiating the substrate with a short wavelength laser light at approximately the same time the target is irradiated with laser light from a short wavelength laser 8a of 1J/cm², as shown in FIG. 3. The same effect as in the above-described embodiment can be achieved.

Figure 4:
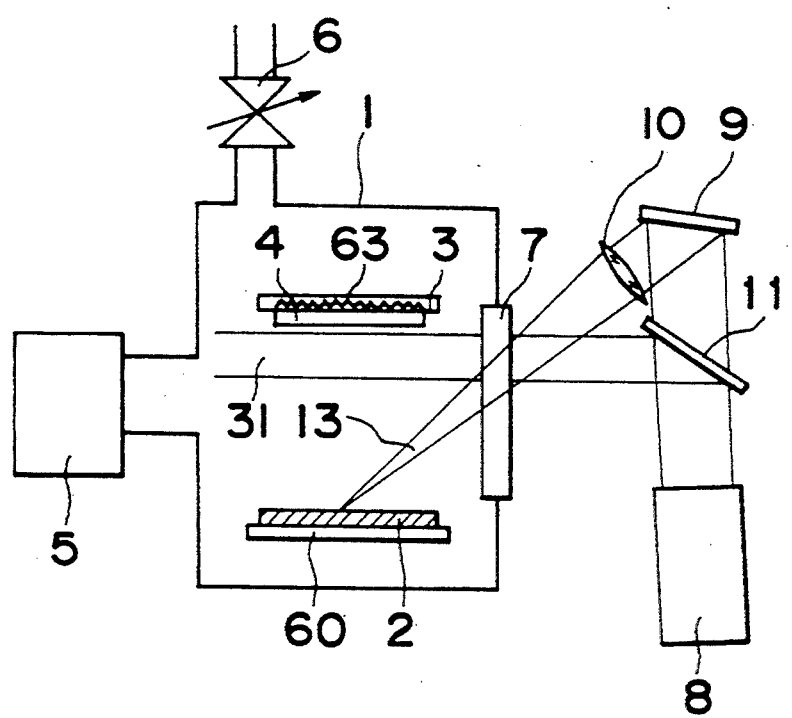
FIG. 4 is a schematic diagram of a second embodiment of a laser ablation device according to the present invention.

A second embodiment of a laser ablation device and film forming method according to the present invention will be described below. The structure of the device will first be described with reference to FIG. 4.

The second embodiment is different from the first embodiment in that instead of irradiating the substrate 4 with the short wavelength laser light 14, a short wavelength laser light 31 is reflected by the half mirror 11 to pass through the light-transmittable window 7 into the vicinity (e.g. within 30 mm of the substrate 22.

Figure 5:
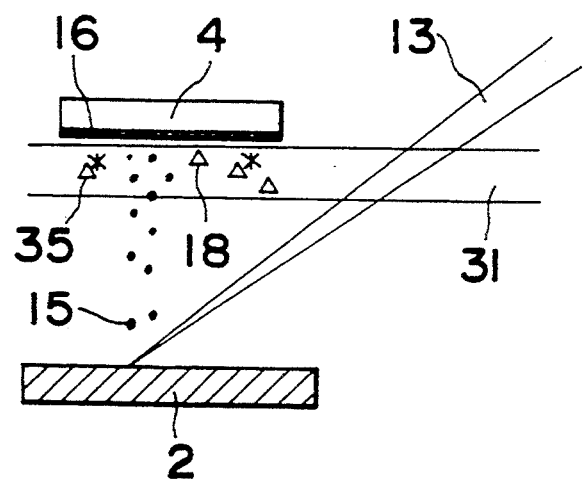
FIG. 5 shows the operation of the device of FIG. 4.
Figure 6:
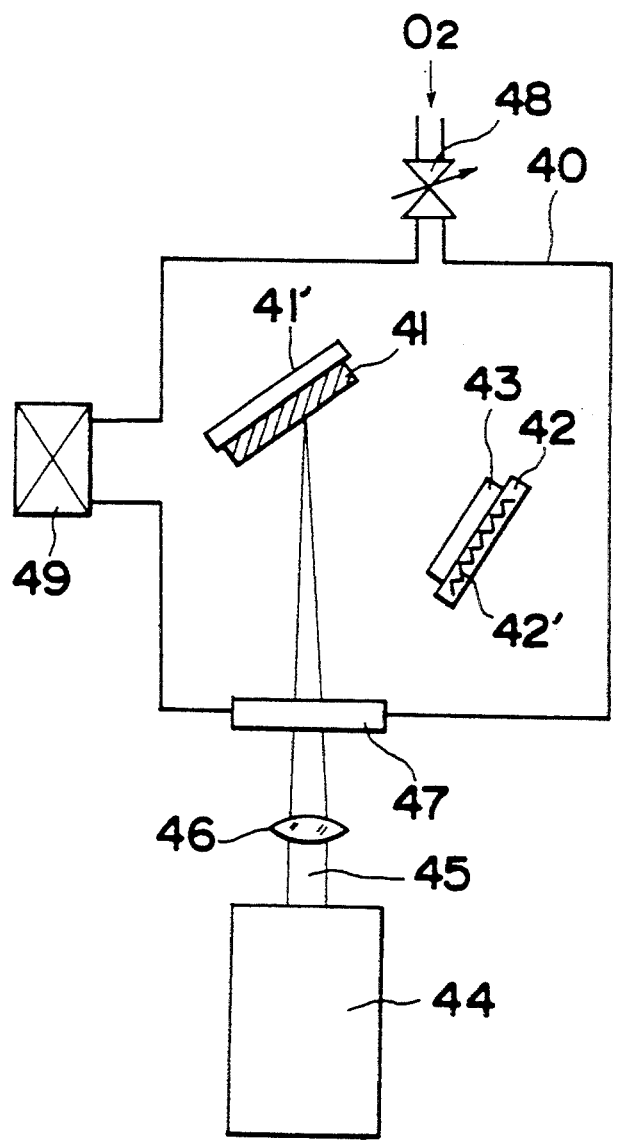
FIG. 6 is a schematic diagram of a conventional laser ablation device.

The operation of the above-described laser ablation device is similar to that of the first embodiment. Only the difference between the operations will be described with reference to FIGS. 4 and 5.

When the short wavelength laser light is emitted from the short wavelength laser 8, part of the laser light passes through the half mirror 11, is reflected by the mirror 9 and condensed by the lens 10, and finally reaches the target 2, as short wavelength laser light 13, via the light-transmittable window 7. The remaining part of the laser light 30 passes in the vicinity (within 30 mm) of the substrate 4 as short wavelength laser light 31 after it is reflected by the half mirror 11 through the light-transmittable window 7. As a result, ablated particles 15 of the sintered body of Ni-Zn-ferrite constituting the target 2 are projected from the target 2, so that a thin film 16 is formed from the ablated particles 15 migrating over or moving about the substrate 4 held by the substrate holder 3. At the time this thin film 16 is formed, since the short wavelength laser light 31 passes in the vicinity of the substrate 4, the ablated particles 15 are excited before reaching the substrate 4, thereby improving the reactivity. Accordingly, the reaction of the ablated particles 15 with $O_2$ molecules 18 of the oxidating gas in the vicinity of the substrate 4 is promoted, thus reducing the oxygen deficiency of the thin film 16. At the same time, $O_2$ molecules 18 in the vicinity of the substrate 4 are excited by the short wavelength laser light 31 into O radicals 35, and therefore, the reaction of the $O_2$ molecules 18 with the ablated particles 15 or the excited ablated particles is enhanced, whereby the oxygen deficiency of the thin film 16 is reduced.

Further, since the excited ablated particles 15 are deposited on the substrate 4, the crystallizability of the thin film 16 is improved. Even when the substrate is kept at 300° C. or so (through heating by the built-in heater 63 of the substrate holder 3), it is possible to obtain a Ni-Zn-ferrite film of a spinel single structure-crystal. That is, the magnetic properties are improved, similar to the preceding embodiment.

Although Ni-Zn-ferrite is used as a film forming material in the above-described embodiments, the present invention is not limited to an Ni-Zn-ferrite target. The same oxidation accelerating effect and the improvement of crystallizability are attained so long as the material is an oxide. Moreover, the oxidating gas is not limited to $O_2$ or $N_2O$.

According to the first embodiment of the laser ablation device of the present invention, a thin film of an oxide is formed by the ablating effect of the laser light, and the ablated particles migrating over an object are excited by short wavelength laser light irradiating the object. Therefore, the ablated particles readily react with the oxidating gas in the vicinity of the object, the oxidation is accelerated and the oxygen deficiency of the formed film is reduced, and the crystallizability is improved. Annealing at high temperatures for the purpose of improving the oxidation state becomes unnecessary.

According to the second embodiment of the laser ablation device of the present invention, a thin film of an oxide is formed by the ablating effect of the laser light, the short wavelength laser light passes parallel to and in the vicinity of the surface of an object, and the ablated particles before reaching the object are excited and separated from the oxidating gas in the vicinity of the object to generate O radicals. Therefore, the oxidation between the ablated particles and O radicals is enhanced and the oxygen deficiency of the formed film is reduced, and the crystallizability is improved. High-temperature annealing for the purpose of improving the oxidation state is thus not required.

In the first and second embodiments of the present invention, the short wavelength laser light irradiating device includes an optical system for splitting the short wavelength laser light emitted by the short wavelength laser, and accordingly, only a single short wavelength laser is used. Additionally, since the short wavelength laser light 14 is separated from the short wavelength laser light 13 by the half mirror 11, the operational effects of the laser lights 13 and 14 are synchronized.

According to the second embodiment of the thin film forming method of the present invention, the above laser ablation device is used to form a thin film on the object from a soft magnetic oxide material employed as a target. Therefore, a thin film of good crystallizability with little oxygen deficiency is obtained. A high-temperature annealing process conventionally required for improving the oxidation state is not used, yet a soft magnetic thin film of low coercive force is obtained.

Although the present invention has been fully described in connection with the preferred embodiments thereof with reference to the accompanying drawings, it is to be noted that various changes and modifications will become apparent to those skilled in the art. Such changes and modifications are to be understood as included within the scope of the present invention as defined by the appended claims unless they otherwise depart therefrom.

We claim:

1. A laser ablation device for forming a thin film, said device comprising:
    a vacuum chamber having a discharge port through which the chamber is evacuated, a gas introduction port through which an oxidating gas is introduced into the chamber, and a light-transmittable section;
    a target holder disposed in the vacuum chamber;
    a target, from which a film is to be formed, held by said target holder, said target comprising an oxide;
    an object holder confronting the target holder;
    a short wavelength laser disposed outside of said vacuum chamber at such a position as to emit a first short wavelength laser light passing through the light-transmittable section from outside of the vacuum chamber and onto said target in the vacuum chamber; and
    short wavelength laser light irradiating means for irradiating an object held by the object holder in the vacuum chamber with short wavelength laser light passing through the light-transmittable section from outside of the vacuum chamber, the second short wavelength laser light having an intensity lower than that of the first short wavelength laser light irradiating the target.

2. The laser ablation device as claimed in claim 1, wherein the second short wavelength laser light irradiating the object has an intensity of at most 1/10 of that of the first short wavelength laser light irradiating the target.

3. The laser ablation device as claimed in claim 1, wherein the oxide is a ferrite, and the second short wavelength laser light irradiating the object has an intensity of 1/10 of that of the first short wavelength laser light irradiating the target.

4. The laser ablation device as claimed in claim 1, wherein a single short wavelength laser emits both the first short wavelength laser light and the second short wavelength laser light, and said irradiating means is an optical system which splits short wavelength laser light from the short wavelength laser into the first and second short wavelength laser lights.

5. A laser ablation device for forming a thin film, said device comprising:
    a vacuum chamber having a discharge port through which the chamber is evacuated, a gas introduction port through which an oxidating gas is introduced into the chamber, and a light-transmittable section;
    a target holder disposed in the vacuum chamber;
    a target, from which a film is to be formed, held by said target holder, said target comprising an oxide;
    an object holder confronting the target holder;
    a short wavelength laser disposed outside of said vacuum chamber at such a position as to emit a first short wavelength laser light passing through the light-transmittable section from outside of the vacuum chamber and onto said target in the vacuum chamber; and
    short wavelength laser light passing means for causing a second short wavelength laser light to pass from outside of the vacuum chamber through the light-transmittable section and to pass in the vicinity of a surface of an object held by the object holder in the vacuum chamber as approximately parallel to the surface, the second short wavelength laser light having an intensity lower than that of the first short wavelength laser light irradiating the target.

6. The laser ablation device as claimed in claim 5, wherein the second short wavelength laser light irradiating the object has an intensity of at most 1/10 of that of the first short wavelength laser light irradiating the target.

7. The laser ablation device as claimed in claim 5, wherein the oxide is a ferrite, and the second short wavelength laser light irradiating the object has an intensity of 1/10 of that of the first short wavelength laser light irradiating the target.

8. The laser ablation devices as claimed in claim 5, wherein a single short wavelength laser emits both the first short wavelength laser light and the second short wavelength laser light, and said passing means is an optical system which splits short wavelength laser light from the short wavelength laser into the first and second short wavelength laser lights.

9. A method for forming a thin film on an object, said method comprising:
    generating a vacuum in a vacuum chamber;
    placing an object in the vacuum chamber;
    providing a target comprising a soft magnetic oxide in the vacuum chamber;
    introducing an oxidating gas into the vacuum chamber;
    directing a first short wavelength laser light onto the target in the vacuum chamber; and
    irradiating the object in the vacuum chamber with a second short wavelength laser light having an intensity lower than that of the first short wavelength laser light irradiating the target.

10. A method for forming a thin film on an object, said method comprising:
    generating a vacuum in a vacuum chamber;
    placing an object in the vacuum chamber;
    providing a target comprising a soft magnetic oxide in the vacuum chamber;
    introducing an oxidating gas into the vacuum chamber;

directing a first short wavelength laser light onto the target in the vacuum chamber; and passing a second short wavelength laser light in the vicinity of a surface of the object in the vacuum chamber as approximately parallel to the surface of the object, the second short wavelength laser light having an intensity lower than that of the first short wavelength laser light irradiating the target.

11. A laser ablation device for forming a thin film, said device comprising:
- a vacuum chamber having a discharge port through which the chamber is evacuated, a gas introduction port through which an oxidating gas is introduced into the chamber, and a light-transmittable section;
- a target, from which a film is to be formed, disposed in the vacuum chamber, said target comprising an oxide;
- an object holder confronting the target;
- a short wavelength laser disposed outside of said vacuum chamber at such a position as to emit a first short wavelength laser light passing through the light-transmittable section from outside of the vacuum chamber and onto said target in the vacuum chamber; and
- short wavelength laser light irradiating means for irradiating an object held by the object holder in the vacuum chamber with short wavelength laser light passing through the light-transmittable section from outside of the vacuum chamber, the second short wavelength laser light having an intensity lower than that of the first short wavelength laser light irradiating the target.

12. The laser ablation device as claimed in claim 11, wherein the second short wavelength laser light irradiating the object has an intensity of at most 1/10 of that of the first short wavelength laser light irradiating the target.

13. The laser ablation device as claimed in claim 11, wherein the oxide is a ferrite, and the second short wavelength laser light irradiating the object has an intensity of 1/10 of that of the first short wavelength laser light irradiating the target.

14. The laser ablation device as claimed in claim 11, wherein a single short wavelength laser emits both the first short wavelength laser light and the second short wavelength laser light, and said irradiating means is an optical system which splits short wavelength laser light from the short wavelength laser into the first and second short wavelength laser lights.

15. A laser ablation device for forming a thin film, said device comprising:
- a vacuum chamber having a discharge port through which the chamber is evacuated, a gas introduction port through which an oxidating gas is introduced into the chamber, and a light-transmittable section;
- a target, from which a film is to be formed, disposed in said vacuum chamber, said target comprising an oxide;
- an object holder disposed in the vacuum chamber;
- a short wavelength laser disposed outside of said vacuum chamber at such a position as to emit a first short wavelength laser light passing through the light-transmittable section from outside of the vacuum chamber and onto said target in the vacuum chamber; and
- short wavelength laser light passing means for causing a second short wavelength laser light to pass from outside of the vacuum chamber through the light-transmittable section and to pass in the vicinity of a surface of an object held by the object holder in the vacuum chamber as approximately parallel to the surface, the second short wavelength laser light having an intensity lower than that of the first short wavelength laser light irradiating the target.

16. The laser ablation device as claimed in claim 15, wherein the second short wavelength laser light irradiating the object has an intensity of at most 1/10 of that of the first short wavelength laser light irradiating the target.

17. The laser ablation device as claimed in claim 15, wherein the oxide is a ferrite, and the second short wavelength laser light irradiating the object has an intensity of 1/10 of that of the first short wavelength laser light irradiating the target.

18. The laser ablation device as claimed in claim 15, wherein a single short wavelength laser emits both the first short wavelength laser light and the second short wavelength laser light, and said passing means is an optical system which splits short wavelength laser light from the short wavelength laser into the first and second short wavelength laser lights.

* * * * *